United States Patent
Fu et al.

(10) Patent No.: US 9,602,088 B1
(45) Date of Patent: Mar. 21, 2017

(54) ULTRA-LOW POWER COMPARATOR WITH SAMPLING CONTROL LOOP ADJUSTING FREQUENCY AND/OR SAMPLE APERTURE WINDOW

(71) Applicant: TEXAS INSTRUMENTS INCORPORATED, Dallas, TX (US)

(72) Inventors: Wei Fu, Plano, TX (US); Keith Edmund Kunz, Bryan, TX (US); Russell George Byrd, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/852,155

(22) Filed: Sep. 11, 2015

(51) Int. Cl.
*G05F 1/00* (2006.01)
*H02M 3/156* (2006.01)
(Continued)

(52) U.S. Cl.
CPC ........... *H03K 5/00006* (2013.01); *G05F 1/00* (2013.01); *G05F 1/46* (2013.01); *H02M 3/156* (2013.01);
(Continued)

(58) Field of Classification Search
CPC ......... H02M 2001/0048; H02M 3/156; H02M 3/158; H02M 3/1588
(Continued)

(56) References Cited

U.S. PATENT DOCUMENTS

| | | | |
|---|---|---|---|
| 3,970,919 A | * | 7/1976 | Butcher .................. G05B 11/28 323/283 |
| 2012/0025919 A1 | | 2/2012 | Huynh |

(Continued)

FOREIGN PATENT DOCUMENTS

| | | |
|---|---|---|
| CN | 103296880 | 11/2013 |
| CN | 203967969 | 11/2014 |
| RU | 139331 | 2/2012 |

OTHER PUBLICATIONS

Kadirvel et al., "A 330nA Energy-Harvesting Charger with Battery Management for Solar and Thermoelectric Energy Harvesting," 2012 IEEE International Solid-State Circuits Conference, 2012, 978-1-4673-0377-4/12, 3 pages.
Vadim Ivanov, "Analog Techniques for Nano-power Circuits," ISSCC 2015 Tutorial, Feb. 22, 2015, 70 pages.
Hazucha et al., "Area-Efficient Linear Regulator with Ultra-Fast Load Regulation," IEEE Journal of Solid-State Circuits, vol. 40, No. 4, Apr. 2005, 8 pages.

(Continued)

*Primary Examiner* — Timothy J Dole
*Assistant Examiner* — Ishrat Jamali
(74) *Attorney, Agent, or Firm* — John R. Pessetto; Charles A. Brill; Frank D. Cimino

(57) ABSTRACT

Methods and apparatus for minimizing average quiescent current for a desire voltage error in a comparator are disclosed. An example method includes receiving a first voltage and a reference voltage, outputting a second voltage when the first voltage is lower than the reference voltage, wherein the outputting of the second voltage increases the first voltage, counting a number of clock cycles while the first voltage is higher than the reference voltage, comparing the number of clock cycles to a maximum number of clock cycles and a minimum number of clock cycles, when the number of clock cycles is above the maximum number of clock cycles, decreasing a frequency of a clock associated with the number of clock cycles, and when the number of clock cycles is below the minimum number of clock cycles increase the frequency of the clock.

20 Claims, 9 Drawing Sheets

(51) Int. Cl.
*H03K 5/00* (2006.01)
*G05F 1/46* (2006.01)
*H02M 3/158* (2006.01)
*H02M 1/00* (2006.01)

(52) U.S. Cl.
CPC ......... *H02M 3/158* (2013.01); *H02M 3/1588* (2013.01); *H02M 2001/0048* (2013.01)

(58) Field of Classification Search
USPC ................................ 323/222, 271, 282–285
See application file for complete search history.

(56) References Cited

U.S. PATENT DOCUMENTS

| | | | | |
|---|---|---|---|---|
| 2013/0127430 | A1* | 5/2013 | Leung | H02M 3/157 323/282 |
| 2015/0137778 | A1* | 5/2015 | Miyazaki | H02M 3/156 323/271 |

OTHER PUBLICATIONS

Nikolic et al., "Improved Sense-Amplifier-Based Flip-Flop Design and Measurements," IEEE Journal of Solid-State Circuits, vol. 35, No. 6, Jun. 2000, 9 pages.
"TPS6274x 360nA IQ Step Down Converter for Low Power Applications," Texas Instruments, SLVSB02B, Nov. 2013, 32 pages.
Gerhard Thiele, "360nA Buck Converter with >90% Efficiency over more as 4 Decades of Load Current," European technical conference 2014, Jun. 25, 2014, 32 pages.
Gangadhar Burra, "Issues and Challenges in Ultra-low Power Wireless Communication," IEEE Symopsia on VLSI Technology and Circuits 2012, Jun. 12, 2012, 49 pages.
"Controllable Wide Frequency Range Oscillator," Unpublished U.S. Appl. No. 14/581,183, filed Dec. 23, 2014, 20 pages.
International Search Report in corresponding PCT Application No. PCT/US2016/051088, dated Dec. 15, 2016 (2 pages).

* cited by examiner

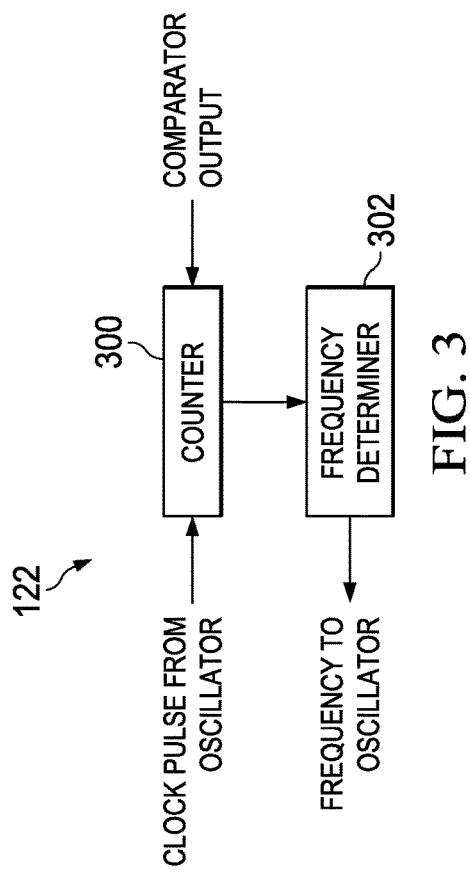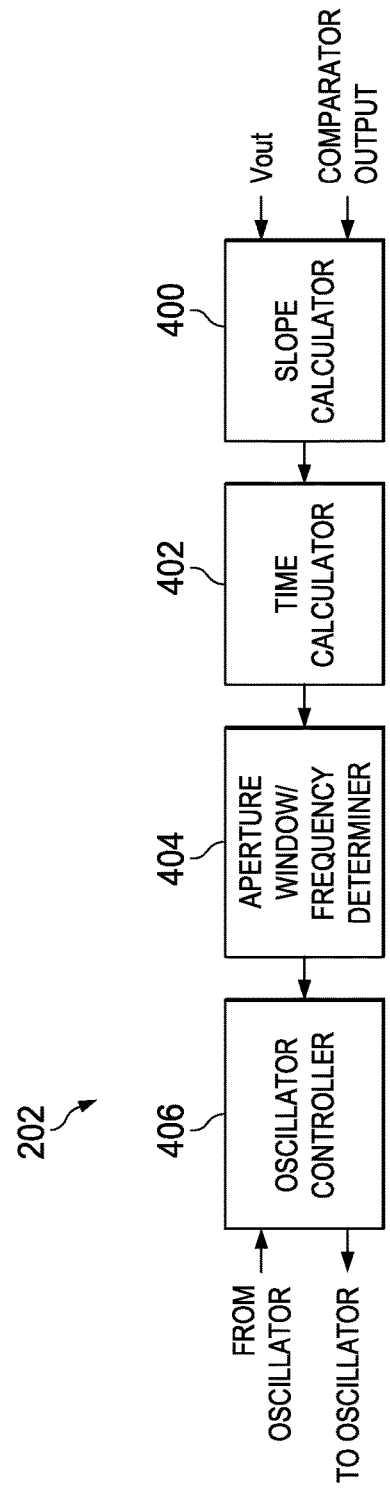

ULTRA-LOW POWER COMPARATOR WITH SAMPLING CONTROL LOOP ADJUSTING FREQUENCY AND/OR SAMPLE APERTURE WINDOW

FIELD OF THE DISCLOSURE

This disclosure relates generally to comparators and, more particularly, to methods and apparatus to adjusting frequency and/or sample aperture window for enabling a comparator.

BACKGROUND

A comparator is a device that outputs a digital signal (e.g., a high voltage or a low voltage) based on a comparison of two inputs. Comparators are used with power converters (e.g., direct current to direct current (DC-DC) converters) to create a feedback circuit to maintain a desired voltage. Like all integrated circuits, comparators draw a continuous quiescent current when powered regardless of whether the comparator is performing a meaningful comparison. The undesired current drawn is called a continuous quiescent current. Reducing average quiescent current, especially while a comparator is not being used, increases battery life and decreases power consumption for electronics containing comparators and/or power converters.

SUMMARY

Examples disclosed herein adjust frequency and/or sample aperture window with a sampling a comparator. An example apparatus disclosed herein includes a comparator to receive a first voltage and a second voltage, and output a second voltage when the first voltage is lower than the reference voltage, wherein the outputting of the second voltage increases the first voltage. In such examples, a controller counts a number of clock cycles while the first voltage is higher than the reference voltage, compares the number of clock cycles to a maximum number of clock cycles and a minimum number of clock cycles. In such examples, when the number of clock cycles is above the maximum number of clock cycles, the controller decreases a frequency of a clock associated with the number of clock cycles. In such examples, when the number of clock cycles is below the minimum number of clock cycles increase the frequency of the clock.

BRIEF DESCRIPTION OF THE DRAWINGS

FIG. 3 is an example block diagram of an example clock controller of FIG. 1.

FIG. 4 is an example block diagram of an example clock controller of FIG. 2.

DETAILED DESCRIPTION

Figure 1:
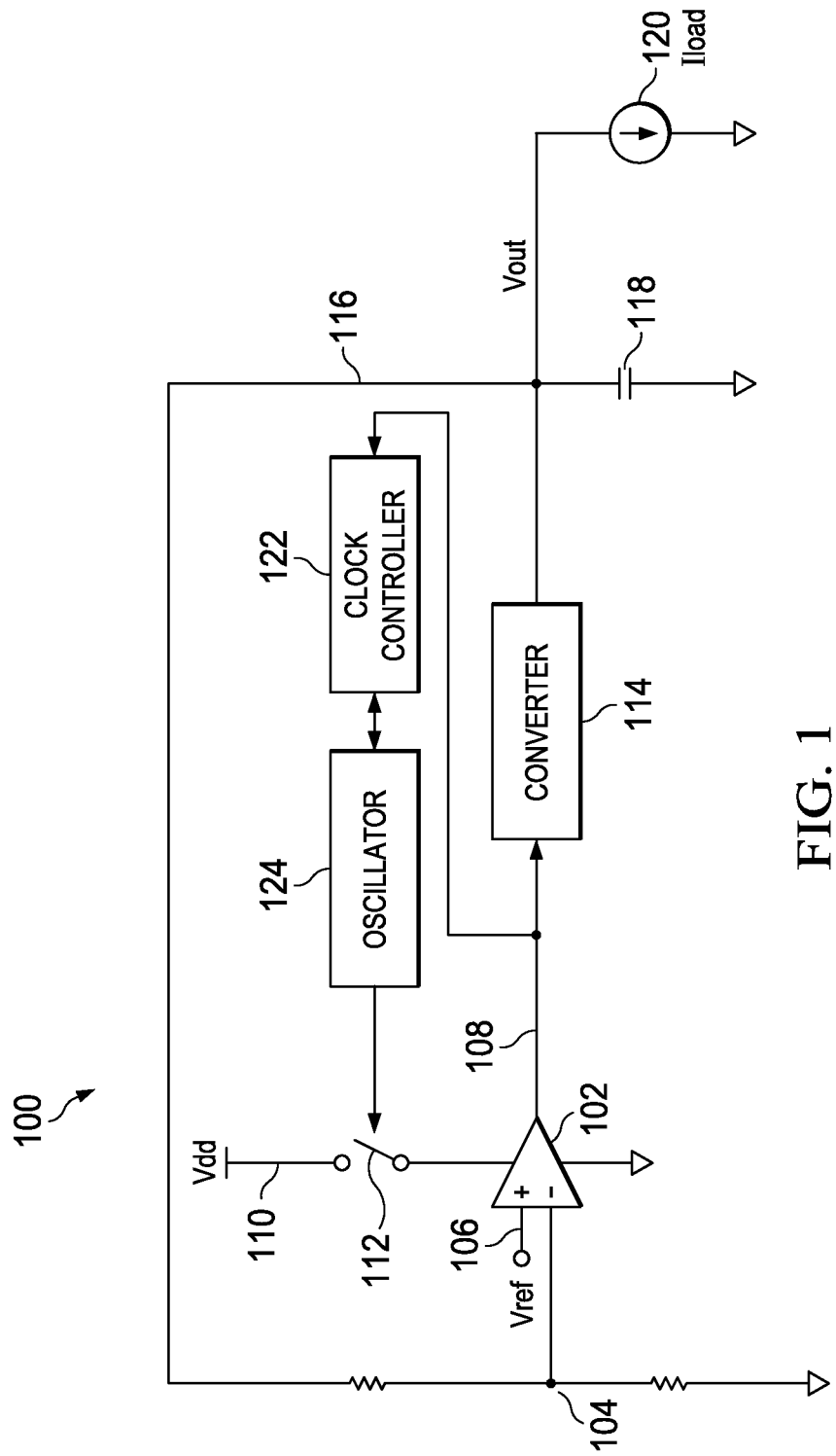
FIG. 1 is an example circuit structured to determine a desired clock frequency associated with powering a comparator.

As portable electronics become more and more common, demands for energy efficiency and extended battery life have become more desirable. A basic requirement for many low power applications is to minimize average quiescent current ($I_q$) (e.g., current drawn when there is no load) during sleep mode. In some examples, electronics are operated in sleep mode for a majority of the time. Consequently, energy efficiency and battery life may be limited more by sleep mode than by active mode. Examples disclosed herein limit average quiescent current ($I_q$) (e.g., current drawn when there is no load) in integrated circuits (ICs) including comparators by dynamically adjusting frequencies of clocks used to power comparators. In some examples, comparators are used to power converters (e.g., direct current to direct current (DC-DC) converters).

A DC-DC converter (e.g., buck converter, boost converter, fly back converter, etc.) operates by receiving an input voltage and outputting a different output voltage. In some examples, the output voltage is greater than the input voltage. Alternatively, the output voltage is less than the input voltage. In some examples, the output voltage is a voltage output by the DC-DC converter to power (e.g., apply a supply voltage to) other components. During sleep mode, the output voltage required to power the other components may be lower than the output voltage required during active mode. However, if the output voltage is too low, the power required to maintain sleep mode may not be fulfilled. Comparators are used as part of feedback loops to control DC-DC converters. Comparators determine when the output voltage is too low (e.g., lower than a threshold or reference voltage) in order to turn the DC-DC converter on to increase the output voltage. Powering comparators at all times provides no voltage error at the price of increasing the amount of $I_q$, which increases the power consumed and decreases battery life.

To minimize $I_q$ of a comparator, the amount of time that the comparator is enabled may be reduced. Methods and apparatus disclosed herein enable the comparator based on a clock cycle. Decreasing a frequency (e.g., bandwidth) of the clock cycle reduces the amount of time that the comparator is enabled (e.g., reducing the $I_q$). However, decreasing the bandwidth increases voltage error. Voltage error is the amount of voltage that an output voltage is below a reference voltage (e.g., based on a minimum required voltage of the integrated circuit (IC)) before the output voltage is increased. For example, a comparator may be enabled every 50 milliseconds. While the comparator is enabled, the comparator may determine that the output voltage is more than the reference voltage. At the next cycle, the comparator may determine that the output voltage is less than the reference voltage. Since the comparator was disabled for 50 milliseconds between the comparator enables, the output voltage may have gone 0.3 Volts below the reference voltage before the second enable occurred. In this manner, the voltage error is 0.3 Volts. A worst case voltage error is based on the relationship between a duration the clock cycle and the slope of the output voltage $$\text{(e.g., } V_{error}(\max) = T_s\left(\frac{d(V_{out})}{dt}\right)\text{,}$$

where Ts is the duration of the clock cycle). The optimal frequency of the clock cycle used to enable the comparator is one which minimizes the frequency based on an allowable voltage error.

Conventional techniques to reduce $I_q$ of a comparator include a timing based sample approach. Such conventional techniques sample the output voltage based on a fixed time constant. A decision to hibernate further is based on the sample voltage at each sample clock edge. $I_q$ is virtually eliminated during hibernation. However, since conventional techniques are based on a fixed time constant, the bandwidth does not change with changes in load current. For example, if the load current drastically increases, the fixed time constant may not be frequent enough to accurately determine when to power a converter (e.g., the voltage error is variable). Examples disclosed herein, balance minimizing $I_q$ with maximizing bandwidth by dynamically adjusting a sampling clock based on the output voltage and the load conditions.

Examples disclosed herein control a comparator using a three phase hibernation system. The first phase is the initialization stage to initialize the comparator and a converter. The second phase is a comparison phase where the comparator is fully powered (e.g., enabled). The clock controller enables the comparator at set points of a clock cycle operating at a sampling frequency. The third phase is a hibernate phase where the comparator is disabled (e.g., not powered) and $I_q$ is virtually eliminated preserving battery life and increasing energy efficiency. The clock controller disables the comparator at set points of the clock cycle operating at the sampling frequency. The sampling frequency may be adjusted based on load conditions. For example, when the load current is low, the clock controller may lower the sampling frequency (e.g., lowering a duration of time in the second phase) and when the load current is high, the clock controller may higher the sampling frequency (e.g., lowering a duration of time in the third phase). In this manner, an appropriate sampling frequency (e.g., a frequency that minimizes $I_q$ without increasing voltage error to an inappropriate level) is determined based on the load conditions to accurately power a converter associated with the comparator.

In some examples, a clock controller counts a number of samples (e.g., based on a frequency of a clock cycle) where an output voltage level is above a preset threshold voltage during a falling edge of the output voltage. In this manner, the clock controller can adjust the frequency of the clock cycle based on the count (e.g., if the count is too low, the clock controller can increase the frequency and if the count is too high, the clock controller can decrease the frequency). Increasing the clock frequency decreases voltage error and increases $I_q$, while decreasing the clock frequency decreases $I_q$ and increases voltage error. When the output voltage is below the preset reference voltage, the comparator outputs a kick voltage (e.g., a high voltage) to enable the converter to increase the output voltage.

In some examples, a clock controller measures the output voltage at two different points in time during the falling edge of an output voltage. In this manner, the clock controller may a) determine the slope of the falling edge of the output voltage and b) determine when the output voltage will be less than or equal to a threshold voltage based on the slope. The slope of the falling edge may be used to set the clock frequency and an aperture window. The aperture window is a duration of time, based on the output voltage nearing the threshold voltage, where sampling of the comparator may be enabled. If the slope is high, the clock controller may increase the aperture window and clock frequency and/or if the slope is low, the clock controller may decrease the aperture window and/or clock frequency. For example, the clock comparator may determine that the falling edge of the output voltage has a slope of 10 mV per microsecond. Based on the slope, the clock controller may determine that the output voltage will equal the reference voltage in 3 microseconds and an appropriate aperture window is 600 nanoseconds. In this manner, the clock controller instructs an oscillator to output a clock cycle (e.g., used to able the comparator) 300 nanoseconds before and 300 nanoseconds after the determined 3 microsecond mark.

An example apparatus disclosed herein includes a comparator to receive a first voltage and a reference voltage and output a second voltage when the first voltage is lower than the reference voltage, wherein the outputting of the second voltage increases the first voltage. In such examples, a controller is to count a number of clock cycles while the first voltage is higher than the reference voltage. In such examples, the controller is to compare the number of clock cycles to a maximum number of clock cycles and a minimum number of clock cycles. In such examples, when the number of clock cycles is above the maximum number of clock cycles, the controller is to decrease a frequency of a clock associated with the number of clock cycles. In such examples, when the number of clock cycles is below the minimum number of clock cycles, the controller is to increase the frequency of the clock.

An example apparatus disclosed herein includes a comparator to receive a first voltage and a reference voltage, and output a second voltage when the first voltage is lower than the reference voltage, the outputting of the second voltage increases the first voltage. In such examples, a controller is to determine a first value of the first voltage at a first time, determine a second value of the voltage at a second time, and determine an aperture window to enable the comparator based on the first based on the first value, the second value, the first time, and the second time.

FIG. 1 is an example block diagram of an illustrated example IC 100 used to control a converter (e.g., a power converter) to optimize bandwidth while decreasing $I_q$. The example IC 100 comprises an example comparator 102, an example scaled output voltage 104, an example reference voltage ($V_{ref}$) 106, an example comparator output 108, an example supply voltage ($V_{dd}$) 110, an example switch 112, an example converter 114, an example $V_{out}$ 116, an example output capacitor 118, an example load current ($I_{load}$) 120, an example clock controller 122, and an example oscillator 124.

In the illustrated example IC 100, the output 108 of the example comparator 102 outputs a high voltage (e.g., a kick) which enables the example converter 114 to output the output voltage $V_{out}$ 116, which is fed back to the comparator 102. The comparator 102 outputs the kick when a) the reference voltage $V_{ref}$ 106 is greater than the scaled output voltage 104 and b) when the example switch 112 is enabled. The switch 112 is enabled based on a clock cycle frequency determined by the example clock controller 122.

The example comparator 102 is a device including two inputs and one output. The example comparator 102 may be an op amp comparator, a Schmitt trigger, a positive feedback comparator, a dedicated comparator IC, and/or any other type of comparator. The example comparator 102 outputs a digital signal based on a comparison of two inputs (e.g., two voltages or two currents). In the illustrated example IC 100, the inputs for the example comparator 102 are the example reference voltage $V_{ref}$ 106 and the example scaled output voltage 104. The example scaled output voltage 104 is the output voltage $V_{out}$ 116 scaled by a voltage divider. In some examples, the scaled output voltage 104 may equal $V_{out}$ 116. The example reference voltage $V_{ref}$ 106 is a voltage based on the minimum voltage required to operate in sleep mode. In some examples the example reference voltage $V_{ref}$ 106 is higher than the minimum required voltage to allow for voltage error. The example comparator output 108 of the example comparator 102 is a low voltage (e.g., 0V) or a high voltage (e.g., a kick) to indicate which input (e.g., the reference voltage $V_{ref}$ 106 or the output voltage $V_{out}$ 104) is larger. For example, when the scaled output voltage 104 is higher than the reference voltage $V_{ref}$ 106, the example comparator outputs a low voltage and when the scaled output voltage 104 is lower than the reference voltage $V_{ref}$ 106, the example comparator outputs the kick (e.g., the high voltage). In some examples, the example comparator 102 is powered by the example supply voltage $V_{dd}$ 110 when the example switch 112 is closed. In this manner, the comparator 102 is enabled when the switch 112 is closed and disabled when the example switch 112 is open. The example switch 112 may be standard switch, a transistor, a vacuum tube, and/or any other device used to interrupt current from one device to another.

The example converter 114 of FIG. 1 converts a first voltage level to a second voltage. In the illustrated IC 100, the example converter 114 is a DC-DC converter. Alternatively, the example converter 114 may be a voltage regulator, a linear regulator, a magnetic converter, an alternating current to direct current (AC-DC) converter (e.g., a rectifier, a mains power supply unit, a switched-mode power supply, etc.), an AC-AC converter (e.g., a transformer, an autotransformer, a voltage converter, a voltage regulator, a cycloconverter, a variable-frequency transformer, etc.), a DC to AC converter (e.g. an inverter), and/or any other device that can convert a first voltage to a second voltage. The example converter 114 regulates the example output voltage $V_{out}$ 116. In some examples, the converter 114 is enabled when it receives the example kick from the comparator 102. In some examples, the converter 114 is enabled for a preset duration of time after receiving the kick regardless of how long the kick was output. Alternatively, the converter 114 may be enabled while the receiving the kick.

The example clock controller 122 of FIG. 1 determines an appropriate frequency of a clock cycle that is used to incrementally enable the example comparator 102. The clock controller 122 may be a microcontroller and/or a processor that is able to execute instructions to adjust the frequency based on pattern changes of the example kick (e.g., due to changes of the load current $I_{load}$ 120, as further described in FIG. 3.

The example oscillator 124 of FIG. 1 outputs clock pulses (e.g., a periodic waveforms) at a desired frequency. The example oscillator 124 may be a feedback oscillator, a relaxation oscillator, or any other type of oscillator. The example oscillator 124 is capable of adjusting the frequency of the clock pulses based on the desired frequency sent by the clock controller 122. In the illustrated example IC 100, the example oscillator 124 outputs a triangle wave. Alternatively, the clock pulse may be a different wave (e.g., a sine wave, a square wave, a saw-tooth wave, a series of pulses, etc.).

In operation, the example comparator 102 compares the example scaled output voltage 104 with the example reference voltage $V_{ref}$ 106. When the scaled output voltage $V_{out}$ 104 is less than the reference voltage $V_{ref}$ 106, the example comparator 102 outputs a kick on the comparator output 108. The example comparator 106 is powered by the example $V_{dd}$ 110 when the example switch 112 is closed. Accordingly, the comparator 102 may only be enabled (e.g., to compare and output the kick) when the switch 112 is closed. When the switch 112 is open, the comparator 102 is disabled and there will be virtually no $I_q$.

When enabled (e.g., activated), the example converter 114 converts a given DC voltage to a desired DC voltage. In some examples, the converter 114 pulses a supply voltage at a given rate (e.g., PWM) to output the desired voltage (e.g., $V_{out}$ 116). The example converter 114 is enabled when the kick is received. When the example kick is not being output by the comparator 102, the example converter 114 may be disabled. While enabled, the example converter 114 outputs the example output voltage $V_{out}$ 116, which charges the example output capacitor 118. Thus, the output across the output capacitor 118 is equal to (e.g., representative of) the output voltage $V_{out}$ 116. While the converter 114 is disabled, the example output capacitor 118 discharges (e.g., the output voltage $V_{out}$ 119 falls). The rate of discharge depends on the example $I_{load}$ 120 (e.g., a larger $I_{load}$ 120 creates a faster rate of discharge and a smaller $I_{load}$ 120 creates a slower rate of discharge). The output voltage $V_{out}$ 116 is feedback into the comparator as the scaled output voltage 104 to complete the feedback loop.

The example clock controller 122 controls the rate at which the example switch 112 is closed and opened. The example clock controller 122 receives the kick from the example comparator output 108. After the kick is received, the clock controller 122 counts a number of clock pulses until the kick is received at a second time. In some examples, the clock controller 122 waits for a preset amount of time (e.g., a delay) before initiating a count to allow the output capacitor 118 to charge. Since the kick 108 enables the example converter 114, which outputs the output voltage $V_{out}$ 116 to charge the output capacitor 118, the duration of time between kicks is based on the falling edge of the output voltage $V_{out}$ 116 (e.g., the rate of discharge of the output capacitor 118). If the number of counts is above a threshold range (e.g., a sampling frequency is too high), the example clock controller 122 instructs the example oscillator 124 to decrease a frequency of the clock pulses (e.g., the number of times the comparator 102 is enabled during a falling edge decreases). If the number of counts is below a threshold range (e.g., the sampling frequency is too low), the example clock controller 122 instructs the example oscillator 124 to increase the frequency of clock pulses (e.g., the number of times the comparator 102 is enabled during a falling edge increases).

The example oscillator 124 outputs clock pulses at a desired frequency. In some examples, the edge (e.g., falling edge and/or rising edge) of each clock pulse (e.g., when the clock is a square wave) closes the example switch 112 for a set duration of time (e.g., a duration long enough for the comparator to compare its inputs). Alternatively, the maximum (e.g., peak), the minimum (e.g., valley) and/or any other distinguishable point may be used to close the example switch 112 for a set duration of time.

To begin a frequency determination process, the example comparator 102 may output a first kick on the comparator output 108. Once the first kick is output, the converter 114 is enabled to increase the output voltage $V_{out}$ 116, which charges the example output capacitor 118. After outputting the kick for a predetermined duration, the comparator output 108 is lowered to a low voltage (e.g. 0 V). After the comparator output 108 goes to the low voltage, the converter 114 disables and the output voltage $V_{out}$ 116 begins to fall (e.g., due to a discharge of the output capacitor 118). Additionally, once the first kick is output, the example clock controller 122 begins to count (e.g., after a preset delay) a number of clock pulses (e.g., based on the (rising) edge of the pulse) between the initial kick being output and a second kick being output on the comparator output 108. The switch 112 is closed at the rising edge of each clock pulse output by the example oscillator 124. At each rising edge (e.g., while the switch 112 is closed) the example comparator 102 compares the falling scaled output voltage 104 to a reference voltage $V_{ref}$ 106. If the scaled output voltage 104 is larger than the reference voltage $V_{ref}$ 106, the example clock controller 122 increments a counter and waits for the next comparison (e.g., the next rising edge of the voltage output by the example oscillator 124). In some examples, the count may be based on a valley, and/or a falling edge of the clock pulse. This example counting process continues until the clock controller 122 receives the second kick. When the scaled output voltage 104 is less than the reference voltage $V_{ref}$ 106, the example comparator 102 will output the second kick. The second kick is received by the example converter 114 and the clock controller 122 to indicate that the scaled output voltage 104 is less than the reference voltage $V_{ref}$ 106. When the second kick is received by the example converter 114, the converter increases the output voltage $V_{out}$ 116, which charges the output capacitor 118 and increases the scaled output voltage 104 to a voltage above the reference voltage $V_{ref}$ 106. When the second kick is received by the example clock controller 122, the clock controller 122 determines whether the count is within a threshold range. If the count is higher than the threshold range (e.g., the frequency of the clock output by the oscillator 124 is too high), the clock controller 122 sends instructions to the oscillator 124 to lower the frequency of the clock. Alternatively, if the count is lower than the threshold range (e.g., the frequency of the clock output by the oscillator 124 is too low), the clock controller 122 sends instructions to the oscillator 124 to increase the frequency of the clock. The example clock controller 122 resets the count to initiate a new count based on the duration of time between the second kick and a third kick.

Figure 2:
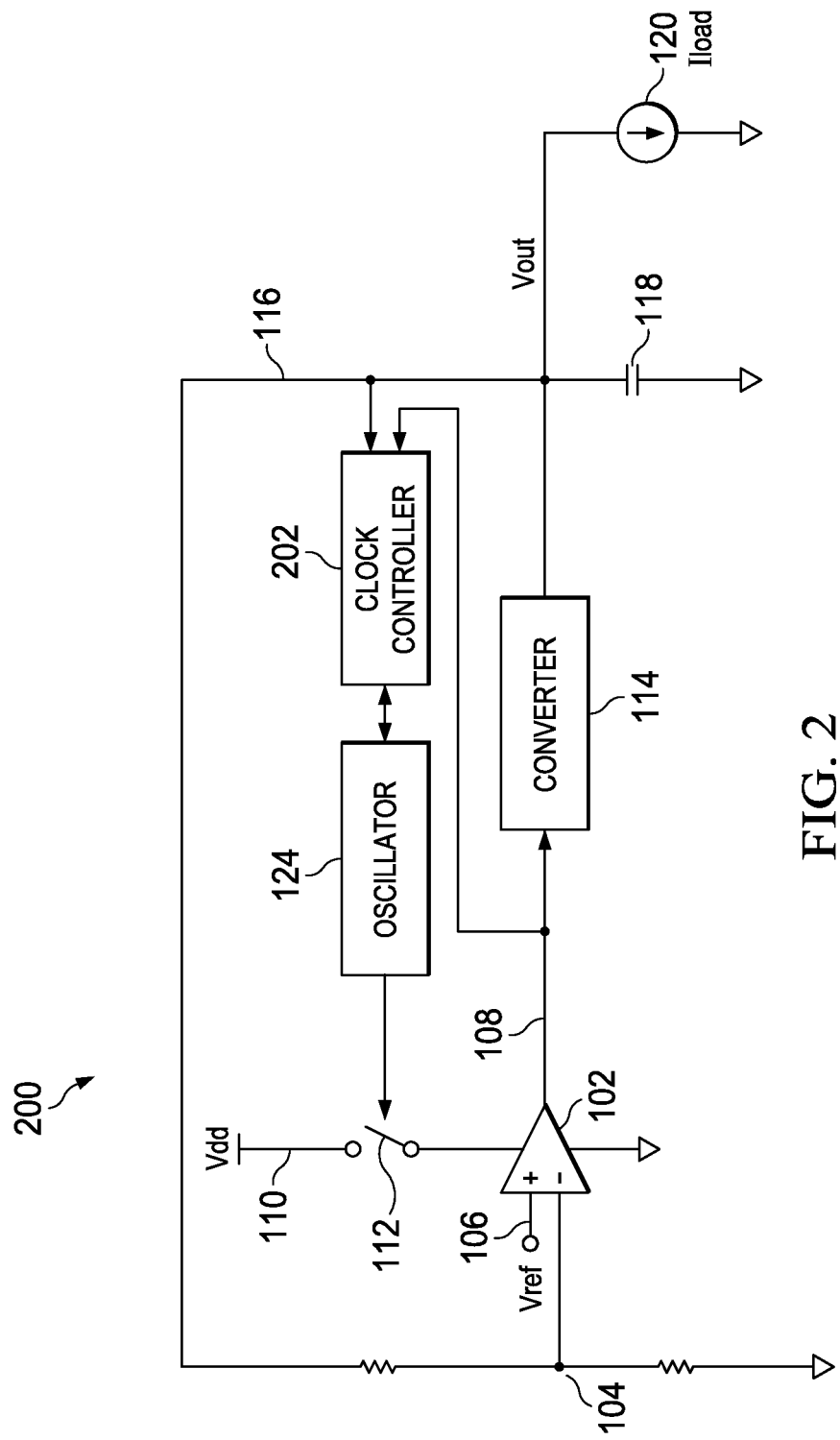
FIG. 2 is an example circuit structured to determine an aperture window and/or a desired clock frequency associated with powering a comparator.

FIG. 2 is an alternative block diagram of an example integrated circuit (IC) 200 used to control a converter to decrease voltage error and $I_q$. The illustrated example IC 200 comprises an example clock controller 202, the example comparator 102, the example scaled output voltage 104, the example reference voltage ($V_{ref}$) 106, the example comparator output 108, the example supply voltage ($V_{dd}$) 110, the example switch 112, the example converter 114, the example $V_{out}$ 116, the example output capacitor 118, the example load current ($I_{load}$) 120, and the example oscillator 124 of FIG. 1. In the example IC 200, the example comparator 102, the example converter 114, an example clock controller 202, and the example oscillator 124 are structured to operate in the same manner as in FIG. 1.

The example clock controller 202 of FIG. 2 determines when the example scaled output voltage 104 will be less than or equal to the reference voltage $V_{ref}$ 106. The example clock controller 202 also determines an appropriate aperture window to sample the comparator 102. The clock controller 202 may be a microcontroller and/or a processor that is able to execute instructions to determine an appropriate aperture window and frequency based on pattern changes (e.g., due to changes in the load current $I_{load}$ 120) of the example kick, as further described in FIG. 4.

In operation, the example comparator 102 compares the example scaled output voltage 104 with the example reference voltage $V_{ref}$ 106. As previously described, the example scaled output voltage $V_{out}$ 104 is the output voltage $V_{out}$ 116 scaled by a voltage divider. In some examples, the scaled output voltage 104 may equal $V_{out}$ 116. The example reference voltage $V_{ref}$ 106 is a voltage based on the minimum voltage required to operate in sleep mode. In some examples the example reference voltage $V_{ref}$ 106 is higher than the minimum required voltage to allow for voltage error. When the scaled output voltage 104 is less than the reference voltage $V_{ref}$ 106, the example comparator 102 outputs a kick on the comparator output 108. The example comparator 106 is powered by the example supply voltage $V_{dd}$ 110 when the example switch 112 is closed. Accordingly, the comparator 102 may only be enabled (e.g., to compare and output the kick) when the switch 112 is closed. When the switch 112 is open, the comparator 102 is disabled and there will be virtually no $I_q$.

As previously described, the example converter 114 converts a given DC voltage to a desired DC voltage. In some examples, the converter 114 pulses a supply voltage at a given rate (e.g., PWM) to output the desired voltage (e.g., $V_{out}$ 116). The example converter 114 is enabled when the kick is received. When the example kick is not being output by the comparator 102, the example converter 114 may be disabled. While enabled, the example converter 114 outputs the example output voltage $V_{out}$ 116, which charges the example output capacitor 118. Thus, the output across the output capacitor 118 is equal to (e.g., representative of) the output voltage Vout 116. While the converter 114 is disabled, the example output capacitor 118 discharges (e.g., the output voltage $V_{out}$ 119 falls). The rate of discharge depends on the example $I_{load}$ 120 (e.g., a larger $I_{load}$ 120 creates a faster rate of discharge and a smaller $I_{load}$ 120 creates a slower rate of discharge). The output voltage $V_{out}$ 116 is feedback into the comparator as the scaled output voltage 104 to complete the feedback loop.

The example clock controller 202 determines the slope of the falling edge of the output voltage $V_{out}$ 116 to predict when the scaled output voltage 104 will be less than the reference voltage $V_{ref}$ 106. The example clock controller 202 also determines an appropriate aperture window to enable sampling of the example comparator 102. The example clock controller 202 receives the kick from the example comparator 102. After the example clock controller 202 receives the kick from the example comparator 102, the example clock controller 202 measures the output voltage $V_{out}$ 116 at two separate points in time during the falling edge of the output voltage $V_{out}$ 116 (e.g., voltage ($V_1$) at time 1 (t1) and $V_2$ and $t_2$). In some examples, the clock controller 122 scales the output voltage $V_{out}$ 116 to match the scaled output voltage 104. Alternatively, the clock controller 202 may measure the scaled output voltage 104 at two separate points in time during the falling edge of the scaled output voltage 104. The two separate points in time may be any two points during the falling edge of the output voltage $V_{out}$ 116. The example clock controller 202 determines a slope (e.g., m) of the falling edge based on the two voltage levels at the two points in time $$\left(e.g., m = \frac{V_2 - V_1}{t_2 - t_1}\right).$$

In this manner, the example clock controller 202 can predict when (e.g., $t_3$) the output voltage $V_{out}$ 116 will be equal to the reference voltage $V_{ref}$ 106

$$\left(e.g., t_3 = \frac{V_{ref} - V_1}{m} + t_1 \text{ or } t_3 = \frac{V_{ref} - V_2}{m} + t_2\right).$$

In some examples, the rate of discharge may not be linear. In such examples, the example clock controller 202 may measure additional voltage at additional times to interpolate and/or extrapolate a function representative of the rate of discharge. In this manner, t3 may be extrapolated base on the determined function. Additionally, the example clock controller 202 may determine an aperture window and a desired frequency based on the determined slope. The aperture window is a window (e.g., duration) of time around the predicted time where the reference voltage will equal the scaled output voltage 104. In this manner, the example comparator 102 may be sampled at a desired frequency within the aperture window to output the kick when the scaled output voltage 104 is below the reference voltage $V_{ref}$ 106.

The example oscillator 124 outputs clock pulses at a desired frequency. In some examples, the edge (e.g., rising edge) of each clock pulse (e.g., when the clock pulse is a square wave) closes the example switch 112 for a set duration of time (e.g., a duration long enough for the comparator to compare its inputs). Alternatively, the maximum (e.g., peak), minimum (e.g., valley) and/or any other distinguishable point of each clock pulse closes the example switch 112 for a set duration of time.

To begin a frequency determination process, the example comparator 102 may output a first kick on the comparator output 108. Once the first kick is output, the converter 114 is enabled to increase the output voltage $V_{out}$ 116, which charges the example output capacitor 118. After outputting the kick for a predetermined duration, the comparator output 108 is lowered to a low voltage (e.g. 0 V). After the comparator output 108 goes to the low voltage, the converter 114 disables and the output voltage $V_{out}$ 116 begins to fall (e.g., due to a discharge of the output capacitor 118). Additionally, once the first kick is output, the example clock controller 202 determines the voltage level at two separate points in time during the falling edge of the output voltage $V_{out}$ 116 to determine a slope of the falling edge. Once the slope has been determined, the example clock controller 202 determines an estimated time when the scaled output voltage 104 will be equal to the reference voltage 106. Additionally, the example clock controller 202 determines the aperture window and frequency to sample the example comparator 102. For example, the example comparator 102 may determine, based on the falling edge slope, that the scaled output voltage 104 will equal the reference voltage $V_{ref}$ 106 at a 3 millisecond mark and that the aperture window should be 500 microseconds with a sample frequency of $1.0 \times 10^{-6}$ Hertz. In this manner, the example clock controller 202 will send a signal to the example oscillator 124 to operate at the $1.0 \times 10^{-6}$ Hertz frequency for 250 microseconds before the 3 millisecond mark until 250 microseconds after the 3 millisecond mark. In some examples, the clock controller 202 may terminate the sampling if the kick is output by the comparator (e.g., indicating that the scaled output voltage 104 is below the reference voltage). In some examples, the clock controller 202 may continue to sample after the aperture window has terminated if the kick has not been output by the comparator 102. Additionally or alternatively, the clock controller 202 may flag an event in which the kick was not output within the aperture window for further error analysis.

Within the aperture window, the switch 112 is closed at the rising edge of each clock pulse output by the example oscillator 124. At each rising edge (e.g., while the switch 112 is closed) the example comparator 102 compares the falling scaled output voltage 104 to a reference voltage $V_{ref}$ 106. If the scaled output voltage 104 is larger than the reference voltage $V_{ref}$ 106, the example clock controller 202 and waits for the next comparison (e.g., the next rising edge voltage output by the example oscillator 124). In some examples, a valley, a peak, failing edge, and/or any other distinguishing point of the clock output may be used to trigger the comparison. This example sampling process continues until the clock controller 202 receives the second kick. When the scaled output voltage 104 is less than the reference voltage $V_{ref}$ 106, the example comparator 102 will output the second kick. The second kick is received by the example converter 114 and the clock controller 202 to indicate that the scaled output voltage 104 is less than the reference voltage $V_{ref}$ 106. When the second kick is received by the example converter 114, the converter increases the output voltage $V_{out}$ 116, which charges the output capacitor 118 and increases the scaled output voltage 104 to a voltage above the reference voltage $V_{ref}$ 106. In some examples, the clock controller 202 may terminate the aperture window when the second kick is received by the clock controller 202. Additionally, the slope, aperture window, and frequency are re-determined based on the falling edge of the output voltage $V_{out}$ 116 between the second kick and a third kick.

FIG. 3 is a block diagram of an example implementation of the example clock controller 122 of FIG. 1, disclosed herein, to operate the example comparator 122 in an energy efficient manner. While the example clock controller 122 of FIG. 3 is described in conjunction with the illustrated example IC 100, the example clock controller 122 may be utilized to control an IC including a comparator. The example clock controller 122 is implemented to control the example IC 100 and/or any device where comparators are used.

The example clock controller 122 of FIG. 3 includes an example counter 300 and an example frequency determiner 302. The example counter 300 counts a number of clock pulses from the example oscillator between kick on the comparator output 108. The frequency determiner 302 determines an optimal sample frequency based on the count from the example counter 300.

The example counter 300 is initiated after receiving a kick from the example comparator output 108. In some examples, the counter 300 is not initiated until after a preset amount of time (e.g., a delay). Once the example counter 300 is initiated, the example counter 300 counts a number of clock pulses from a clock cycle of the example oscillator 124. As previously described, the pulses may be counted based on a maximum of the pulse, a minimum of the pulse, a falling edge of the pulse, a rising edge of the pulse, and/or any other distinguishable points of the clock cycle. The example counter 300 continues to count clock pulses until a second kick is received from the comparator output 108. When the second kick is received, the counter 300 transmits the count to the example frequency determiner 302. Additionally, the example counter 300 resets the count and repeats the described process until an additional kick is received.

The example frequency determiner 302 receives the count from the example counter 300. The example frequency determiner 302 determines whether the count is within an optimal range of counts. The optimal range of counts is a threshold range of counts that balances voltage error and power consumption. For example, if the number of counts is high, the amount of power consumed will also be high, however, if the number of counts is low, the voltage error be high. In some examples, the frequency determiner 302 may determine the optimal range based on a calculation of the maximum allowable voltage error $$\left(\text{e.g., }\left(\text{e.g., }V_{error}(\max) = T_s\left(\frac{d(V_{out})}{dt}\right)\right)\right).$$

Additionally or alternatively, the optimal range may be determined based on user requirements, manufacture requirements, and/or voltage requirements of other IC components within and/or connected to the illustrated example IC 100 of FIG. 1.

If example frequency determiner 302 determines the count is within the threshold range of counts, the example frequency determiner 302 may transmit instructions to the example oscillator 124 to continue to operate at the same clock cycle frequency. Alternatively, the clock controller 122 frequency determiner 302 may only transmit instructions when the oscillator 124 is to change (e.g., increase or decrease) the clock cycle frequency. If the example frequency determiner 302 determines the count is lower than a minimum number of counts of the threshold range, the example frequency determiner 302 determines an appropriate (e.g., desired) frequency needed to increase the number of counts to a number within the threshold range. For example, if the number of counts received is 3 and the minimum number of counts is 6, the frequency determiner 302 may determine that the frequency of the clock cycle needs to increase by a scalar of over 2. Alternatively, if the example frequency determiner 302 determines the count is higher than a maximum number of counts of the threshold range, the example frequency determiner 302 determines an appropriate (e.g., desired) frequency needed to decrease the number of counts to a number within the threshold range. The example frequency determiner 302 transmits instructions to the example oscillator 124 including the desired frequency.

FIG. 4 is a block diagram of an example implementation of the example clock controller 202 of FIG. 2, disclosed herein, to operate the example comparator 122 in an energy efficient manner. While the example clock controller 202 of FIG. 4 is described in conjunction with the illustrated example IC 200, the example clock controller 202 may be utilized to control an IC involving a comparator. The example clock controller 202 is implemented to control the illustrated example IC 200 and/or any device where comparators are used.

The example clock controller 202 of FIG. 4 includes an example slope calculator 400, an example time calculator 402, an example aperture window/frequency determiner 404, and an example oscillator controller 406. The aperture window/frequency determiner 404 determines an aperture window and sample frequency to enable the example comparator 102 based on a calculated slope and/or an estimated time.

The example slope calculator 400 measures the output voltage $V_{out}$ 116 at two separate points in time during after receiving a kick from the comparator output 108 (e.g., during a falling edge of the output voltage $V_{out}$ 116). Alternatively, the example slope calculator 400 may measure the output voltage $V_{out}$ 116 any number of times. For example, if the falling edge of the output voltage $V_{out}$ 116 is not linear, the slope calculator 400 may measure the output voltage $V_{out}$ 116 more than twice in order to interpolate and/or extrapolate a function associated with the falling edge. As previously described, the slope calculator 400 may scale the output voltage $V_{out}$ 116 to match the scaled output voltage 104. Alternatively, the example slope calculator 400 may measure the scaled voltage output 106 directly. In some examples, the first voltage measurement is taken after a preset delay (e.g., to allow the output capacitor 118 to charge). Once the example slope calculator 400 has measured the output voltage $V_{out}$ 116 at two separate times, the example slope calculator 400 calculates the slope based on the two measured voltages at the two times. For example, the slope calculator 400 may measure a first voltage ($V_1$) of the output voltage $V_{out}$ 116 at a first time $t_1$ and a second voltage ($V_2$) at a second time $t_2$. Using algebraic formulas, the example slope calculator 400 determines the slope based on the measured values $$\left(\text{e.g., }m = \frac{V_2 - V_1}{t_2 - t_1}\right).$$

The example slope calculator 400 transmits the slope and measured values to the example time calculator 402 for further processing.

The example time calculator 402 determines (e.g., extrapolates) an estimated time when the output voltage $V_{out}$ 116 will be less than or equal to the reference voltage $V_{ref}$ 106. Since the falling edge of the example voltage output $V_{out}$ 116 is linear, the example time calculator 402 may calculate an analytical function based on the slope and measured values. Algebraically, a formula for a linear function may be represented using point-slope form (e.g., $y-y_1=m(x-x_1)$, where m is the slope of the line and $(x_1, y_1)$ is a coordinate on the line). Using the time as an input and voltage as an output, the following formula is obtained: $V_{ref}-V_1=m(t_3-t_1)$, where $V_{ref}$ is the reference voltage $V_{ref}$ 106, $V_1$ is the first measured voltage, m is the determined slope from the example slope calculator 400, $t_3$ is the estimate time to calculate, and $t_1$ is the time when $V_1$ was measured. Alternatively, $V_1$ and $t_1$ can be replaced with $V_2$ and $t_2$. Solving the example function for $t_3$ results in:

$$t_3 = \frac{V_{ref} - V_1}{m} + t_1.$$

The example time calculator 402 may use the equation for $t_3$ to calculate $t_3$. For example, given a received $V_1$=1.7 V at $t_1$=100 milliseconds (ms) of an output voltage $V_{out}$ 116, a slope of −0.006 V/ms, and a reference voltage $V_{ref}$ 106 of 1.1V. The estimated time $t_3$ when the output voltage $V_{out}$ 116 is equal to the reference voltage $V_{ref}$ 106 is 200 milliseconds $$\left(e.g., t_3 = \frac{1.1 - 1.7 \text{ V}}{-0.006 \text{ V/ms}} + 100 \text{ ms} = 200 \text{ ms}\right).$$

Although the example voltage output $V_{out}$ 116 discharges linearly, the example voltage output $V_{out}$ 116 may discharge exponentially or in another example model and/or function. In such examples, when the falling edge of the output voltage $V_{out}$ 116 is non-linear, various calculations using interpolation and/or extrapolation may be used to calculate the time (e.g., time t3) when the output voltage $V_{out}$ 116 is equal to the reference voltage $V_{ref}$ 106.

The example aperture window/frequency determiner 404 determines an appropriate aperture window and/or sampling frequency based on the calculated slope. In some examples, the aperture window/frequency determiner 404 determines an appropriate aperture window to account for an error in the time calculation, a change in $I_{load}$ 120 (which changes the slope of the output voltage $V_{out}$ 122), and/or any other variation in the illustrated example IC 200. Decreasing the aperture window saves power by only powering the example comparator 102 within a smaller duration of time (e.g., when it is needed). Increasing the aperture window decreases voltage error.

Additionally, the aperture window/frequency determiner 404 determines an appropriate clock cycle frequency to operate the example oscillator 124. For example, if the slope is large, the aperture window/frequency determiner 404 may increase the clock cycle frequency in order to minimize voltage error. In some examples, the frequency determiner 302 may determine the optimal range based on a calculation of the maximum allowable voltage error $$\left(e.g., \left(e.g., V_{error}(\max) = T_s\left(\frac{d(V_{out})}{dt}\right)\right)\right).$$

Additionally or alternatively, the optimal aperture window and/or clock cycle frequency for a given slope may be based on a user requirement, a manufacture requirement, and/or voltage requirements of other IC components within and/or connected to the example IC 200 of FIG. 2. In some examples, the aperture window is correlated to the sampling frequency. For example, if the aperture window is small, the sampling frequency may need to higher in order to determine when the reference voltage $V_{ref}$ 106 is lower than the output voltage $V_{out}$ 122. Once the aperture window/frequency determiner 404 determines an optimal aperture window and/or clock cycle frequency based on the calculated time and slope, the example oscillator controller 406 transmits instructions to the example oscillator 124 to operate at the determined frequency for the determine aperture window around the estimated time. For example, for an estimated time of 3 milliseconds with determined aperture window of 500 microseconds with a desired clock cycle frequency of $1.0 \times 10^{-6}$ Hertz. In this manner, the example oscillator controller 406 will instruct the example oscillator 124 to output a sample clock at $1.0 \times 10^{-6}$ Hertz for a duration of 250 microseconds before the 3 millisecond mark to 250 microseconds after the 3 millisecond mark.

Figure 5:
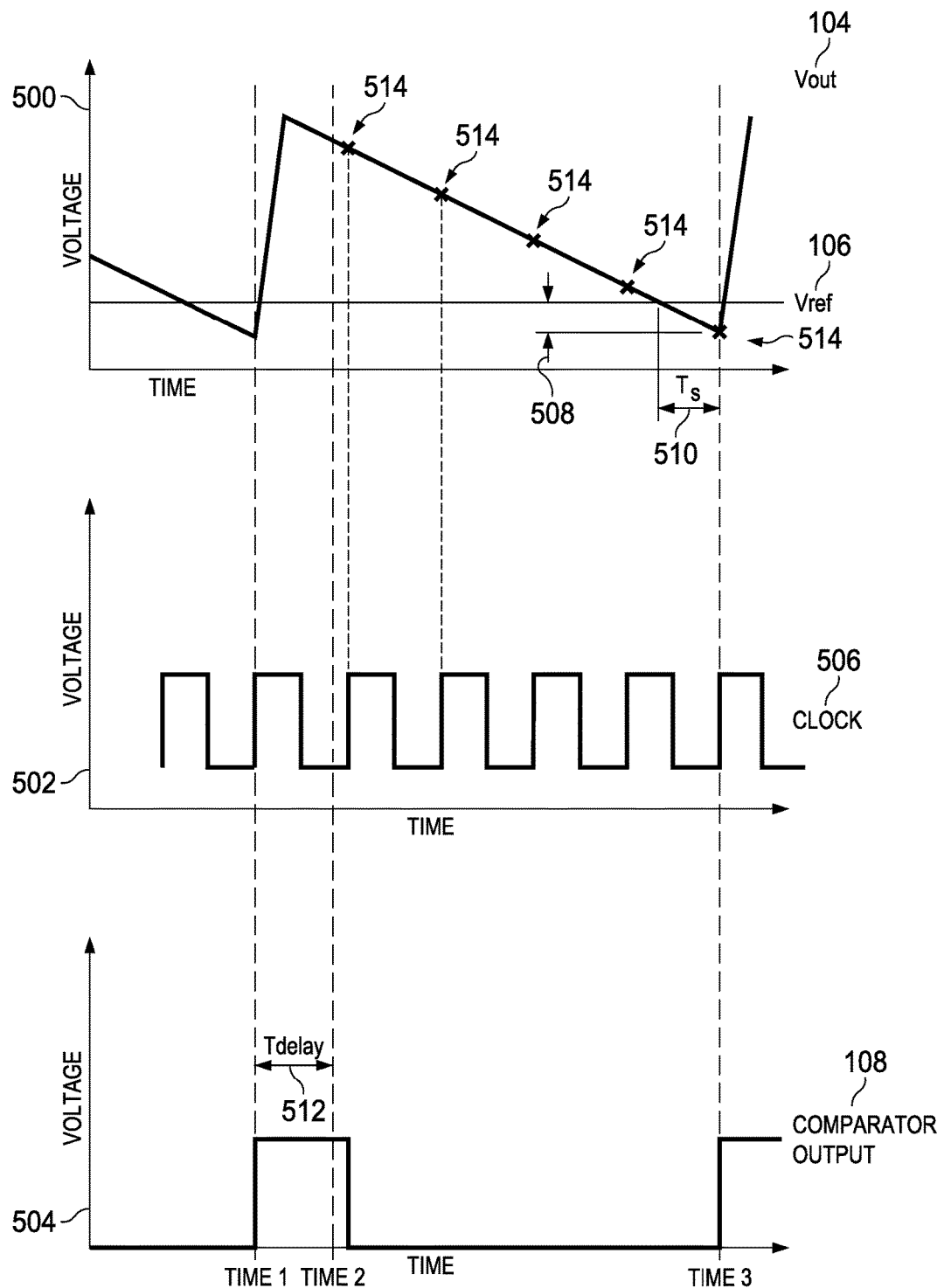
FIG. 5 is a graph illustrating example voltage sequences used by the clock controller of FIG. 3 to determine a clock frequency.

FIG. 5 includes an example graph 500 of a timing of the scaled output voltage 104 and the example reference voltage $V_{ref}$ 106, an example graph 502 of an example output from the example oscillator 124, and an example graph 504 of the timing the example comparator output 108 of FIG. 1 in conjunction with the clock controller 122 of FIG. 3. The example graphs 500, 502, and 504 include an example voltage error 508, an example clock cycle 506, an example error period $T_s$ 510, an example delay $T_{delay}$ 512, and an example count of clock pulses 514.

In the illustrated example of FIG. 5, the example oscillator 124 outputs the clock cycle at a frequency. As previously described, increasing the frequency of the clock cycle 506 increases the bandwidth (e.g., reducing the voltage error 508) at the expense of power consumption (e.g., increase $I_q$). The example voltage error 508 represents an amount of voltage that the scaled output voltage 104 goes below a reference voltage $V_{ref}$ 106 before the kick is applied. In this example the example error period $T_s$ 510, represents the duration of time that the scaled output voltage 104 is below the reference voltage $V_{ref}$ 106. The example comparator 102 compares the scaled output voltage 104 with the reference voltage $V_{ref}$ 504 at each peak, valley, falling edge, and/or rising edge in the example clock cycle 506. At time1, the example comparator 102 determines that the scaled output voltage 104 is less than the reference voltage $V_{ref}$ 106. Since the scaled output voltage 104 is less than the reference voltage $V_{ref}$ 106, the example comparator 102 outputs a kick (e.g. a high voltage) on the comparator output line 108, as shown in graph 504.

Once the kick is applied, the example clock controller 112 waits for the example delay $T_s$ 512 before initiating the example counter 300 of FIG. 3. At time2 (e.g., after the delay $T_{delay}$ 512), the example counter 300 tracks a count of clock pulses 514 (e.g., based on the peaks, valleys, rising edges, and/or falling edges of the clock cycle 506) between kicks on the comparator output 108. The example counter 300 continues to increment the count of clock pulses 514 until time3, when the comparator output 108 applies another kick (e.g., because at time3 the scaled output voltage 104 is lower than the reference voltage). Once the second kick is applied, the counter 300 transmits the count of clock pulses 514 to the example frequency determiner 302. As previously described, the frequency determiner 302 may adjust the frequency of the clock cycle 506 based on the count of clock pulses 514 (e.g. to decrease voltage error or to decrease power consumption).

Figure 6:
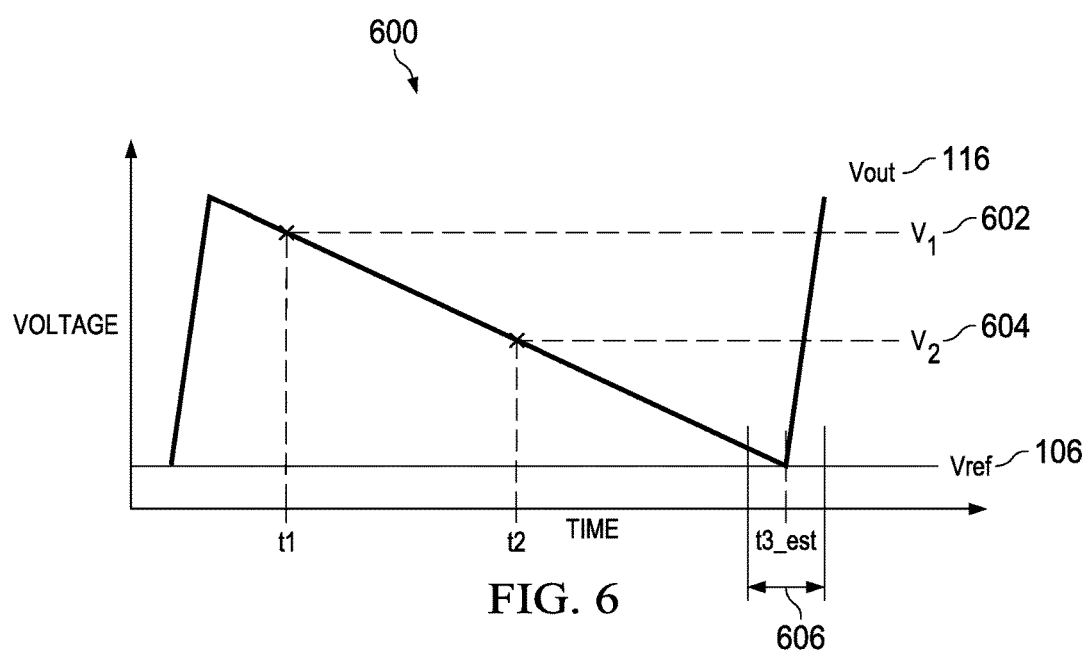
FIG. 6 is a graph illustrating example voltage sequences used by the clock controller of FIG. 4 to determine an aperture window and/or a clock frequency.

FIG. 6 is an example graph 600 of the timing of the output voltage $V_{out}$ 116 and the reference voltage $V_{ref}$ 106 of FIG. 2 in conjunction with the clock controller 202 of FIG. 4. The example graph 600 includes an example first voltage $V_1$ 602, an example second voltage $V_2$ 604, and an example aperture window 606. Although the example graph 600 includes the example output voltage $V_{out}$ 116, the output voltage $V_{out}$ 116 may be scaled to represent the scaled output voltage 104, the reference voltage 106 may be scaled to compensate for the scaling of the output voltage $V_{out}$ 116, or the output voltage $V_{out}$ 116 may equal the scaled output voltage 104. The example graph 600 displays the output voltage $V_{out}$ 116 after a kick is output by the example comparator 102 causing the output voltage $V_{out}$ 116 to rise until the example output capacitor 118 is fully charged. As previously described, the slope of a falling edge of the example output voltage $V_{out}$ 116 is determined based on measurements of the output voltage $V_{out}$ 116 at different points in time.

In the illustrated example of FIG. 6, the example slope calculator 400 measures the first example voltage $V_1$ 602 at time t1. Additionally, the example slope calculator 400 measures the second example voltage $V_2$ 604 at time t2. The slope calculator 400 determines a slope based on $V_2$ 602, $V_1$ 604, t1, and t2. Alternatively, the slope calculator 400 may measure additional voltages at additional times to extrapolate a function (e.g., for non-linear falling edges). Once the slope has been calculated, the example time calculator 402 determines an estimate time t3_*est* where the output voltage $V_{out}$ 116 will equal the reference voltage $V_{ref}$ 106.

The example aperture window/frequency determiner 404 determines the example aperture window 606 and a desired frequency based on the slope and/or the estimate time t3_*est*. In some examples, a clock output of the oscillator 124 is disabled outside the example aperture window 606 to save power. Within the aperture window 606, the oscillator 124 enables the clock output at the desired frequency to enable the example comparator 102 at each peak, valley, rising edge, and/or falling edge of a clock cycle operating at the desired frequency (e.g., such as previously described in FIG. 5).

Figure 7:
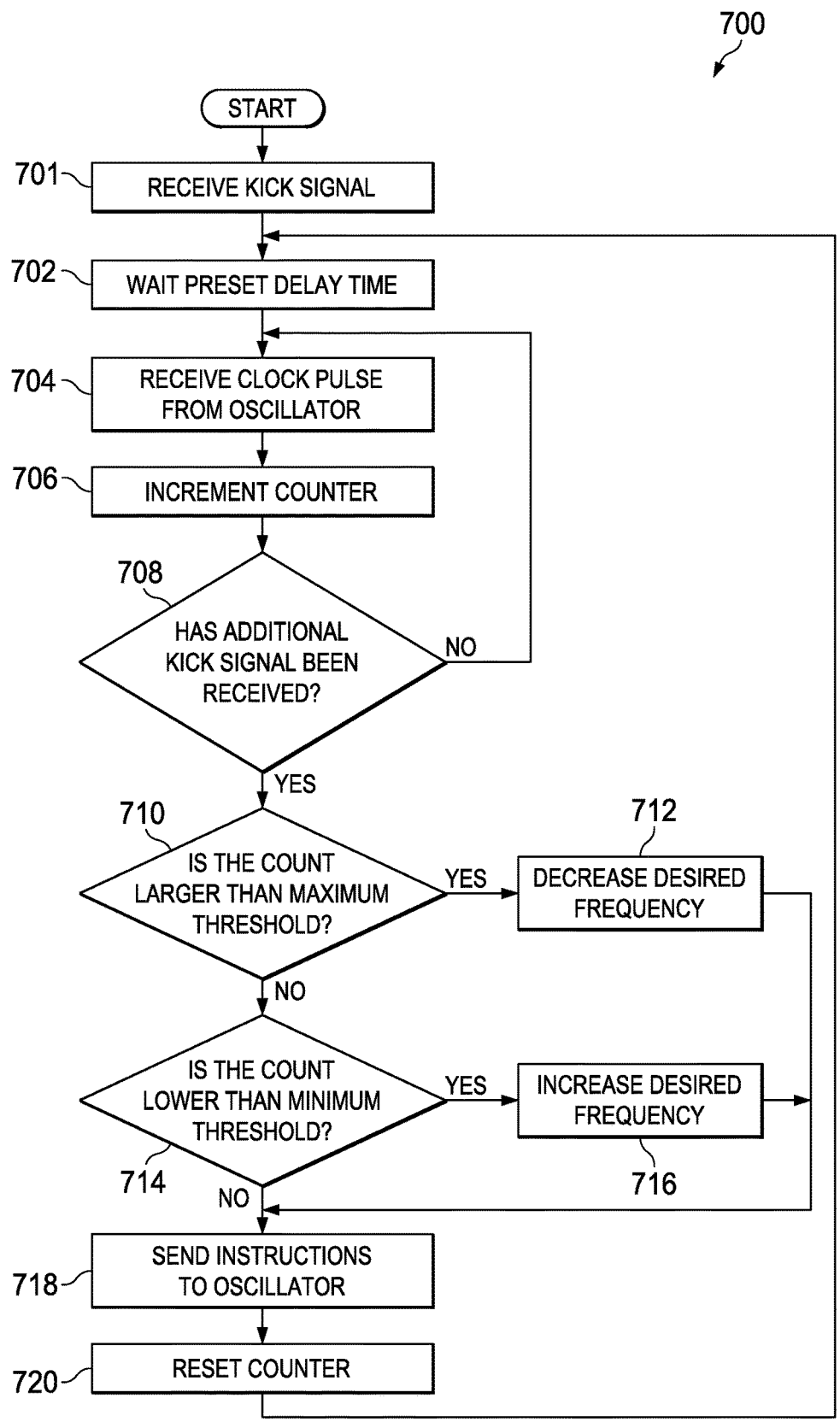
FIG. 7 is a flowchart representative of example machine readable instructions that may be executed to implement the example clock controller of FIG. 3 to adjust the clock frequency to control the example comparator of FIG. 1.

While example manners of implementing the example clock controllers 122, 202 of FIGS. 1 and 2 are illustrated in FIGS. 3 and 4, elements, processes and/or devices illustrated in FIG. 7 may be combined, divided, re-arranged, omitted, eliminated and/or implemented in any other way. Further, the example counter 300, the example frequency determiner 302, and/or, more generally, the example clock controller 122 of FIG. 3, and/or the example slope calculator 400, the example time calculator 402, the example aperture window/ frequency determiner 404, the example oscillator controller 406, and/or, more generally, the example clock controller 202 of FIG. 4 may be implemented by hardware, machine readable instructions, software, firmware and/or any combination of hardware, machine readable instructions, software and/or firmware. Thus, for example, any of the example counter 300, the example frequency determiner 302, and/or, more generally, the example clock controller 122 of FIG. 3, and/or the example slope calculator 400, the example time calculator 402, the example aperture window/ frequency determiner 404, the example oscillator controller 406, and/or, more generally, the example clock controller 202 of FIG. 4 could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example counter 300, the example frequency determiner 302, and/or, more generally, the example clock controller 122 of FIG. 3, and/or the example slope calculator 400, the example time calculator 402, the example aperture window/ frequency determiner 404, the example oscillator controller 406, and/or, more generally, the example clock controller 202 of FIG. 4 is/are hereby expressly defined to include a tangible computer readable storage device or storage disk such as a memory, a digital versatile disk (DVD), a compact disk (CD), a Blu-ray disk, etc. storing the software and/or firmware. Further still, the example clock controllers 122, 202 of FIGS. 3 and 4 include elements, processes and/or devices in addition to, or instead of, those illustrated in FIGS. 5 and 7, and/or may include more than one of any or all of the illustrated elements, processes and devices.

Flowcharts representative of example machine readable instructions for implementing the clock controllers 122, 202 of FIGS. 3 and 4 are shown in FIGS. 5 and 7. In the examples, the machine readable instructions comprise a program for execution by a processor such as the processor 1012 shown in the example processor platform 1000 discussed below in connection with FIG. 10. The program may be embodied in machine readable instructions stored on a tangible computer readable storage medium such as a CD-ROM, a floppy disk, a hard drive, a digital versatile disk (DVD), a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowcharts illustrated in FIGS. 5 and 7, many other methods of implementing the example clock controllers 122, 202 of FIGS. 3 and 4 may alternatively be used. For example, the order of execution of the blocks may be changed, and/or some of the blocks described may be changed, eliminated, or combined.

As mentioned above, the example processes of FIGS. 5 and 7 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 5 and 7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

The example machine readable instructions illustrated in FIG. 7 may be executed to cause the clock controller 122 of FIG. 3 to adjust a clock cycle frequency in conjunction with FIG. 1. Although the example flowchart 700 of FIG. 7 depicts example steps in a given order, these steps are not exhaustive, various changes and modifications may be affected by one skilled in the art within the spirit and scope of the disclosure. For example, blocks illustrated in the flowchart 700 may be performed in an alternative order or may be performed in parallel.

FIG. 7 is an example flowchart 700 representative of example machine readable instructions that may be executed to cause the clock controller 122 of FIG. 3 to adjust a clock cycle frequency to enable the example comparator 102 of FIG. 1. Since the falling edge of the output voltage $V_{out}$ 116 depends on the example load current $I_{load}$ 120 which can change at any moment, the clock frequency used to enable the example comparator 102 may be adjusted to either reduce voltage error or decrease power consumption. Determining how and/or when to adjust the clock cycle frequency is accomplished by monitoring a duration of time between kicks which is indicative of variance in the output voltage $V_{out}$ 116.

At block 701, the example counter 300 receives a kick on the comparator output 108. As previously described, the kick is output when the example scaled output voltage 104 is less than the example reference voltage $V_{ref}$ 106. The kick enables the example converter 114 to increase the output voltage $V_{out}$ 116 which is stored in the output capacitor 118. Once the example converter 114 is disabled, the charge in the output capacitor 118 begins to discharge (e.g., $V_{out}$ 116 begins to fall). At block 702, the counter 300 waits a preset delay time to allow the output capacitor 118 to fully charge. In some examples, the preset delay is a duration of time less than a difference between the estimated time when the output voltage $V_{out}$ 116 is equal to reference voltage $V_{ref}$ 106 and a time when the output voltage $V_{out}$ 116 begins to fall. The amount of preset delay time may be based on user and/or manufacturer preferences. In some examples the present delay time may be based on characteristics of the output capacitor 118 and/or the characteristics of ICs associated with the load current $I_{load}$ 120.

At block 704, the example counter 300 receives a clock pulse from the example oscillator 124. When the counter 300 receives a clock pulse, the counter 300 increments a count (block 706). As previously described, the count of the clock pulse may be based on a maximum, a minimum, a falling edge, a rising edge, and/or any other distinguishing points of a clock signal. At block 708, the example counter 300 determines whether an additional (e.g., second) kick signal has been received. An additional kick signal implies that the scaled output voltage 104 has fallen below the reference voltage $V_{ref}$ 106 (e.g., thus the output voltage $V_{out}$ 116 will rise again). If the second kick signal has not been received by the example counter, the counter 300 continues to receive clock pulses and increment the count until the second kick signal is received. If the second kick signal has been received by the example counter 300, the counter 300 transmits the count to the example frequency determiner 302.

At block 710, the example frequency determiner 302 determines whether the count is larger than a maximum threshold. As previously described, a count larger than the maximum threshold is indicative of a waste in power (e.g., the comparator 102 is being enabled too much). If the count is larger than the maximum threshold, the frequency determiner 302 will decrease the desired frequency so that the count will meet the maximum threshold (block 712). If the count is not larger than the maximum threshold, the frequency determiner 302 determines if the count is lower than a minimum threshold (block 714). As previously described, a count lower than a minimum threshold is indicative of potentially large voltage error (e.g., not enough bandwidth). If the count is lower than the minimum threshold, the example frequency determiner 302 will increase the desired frequency so that the count will meet the minimum threshold (block 716). If the count is not lower than the minimum threshold, the example frequency determiner 302 will not adjust the desired frequency. At block 718, the frequency determiner 302 will transmit instructions to the example oscillator 124 to operate at the desired frequency. At block 120, the counter 300 resets the count. The process continues indefinitely between kick signals to determine the desired frequency based on changes in the load current 120.

Figure 8:
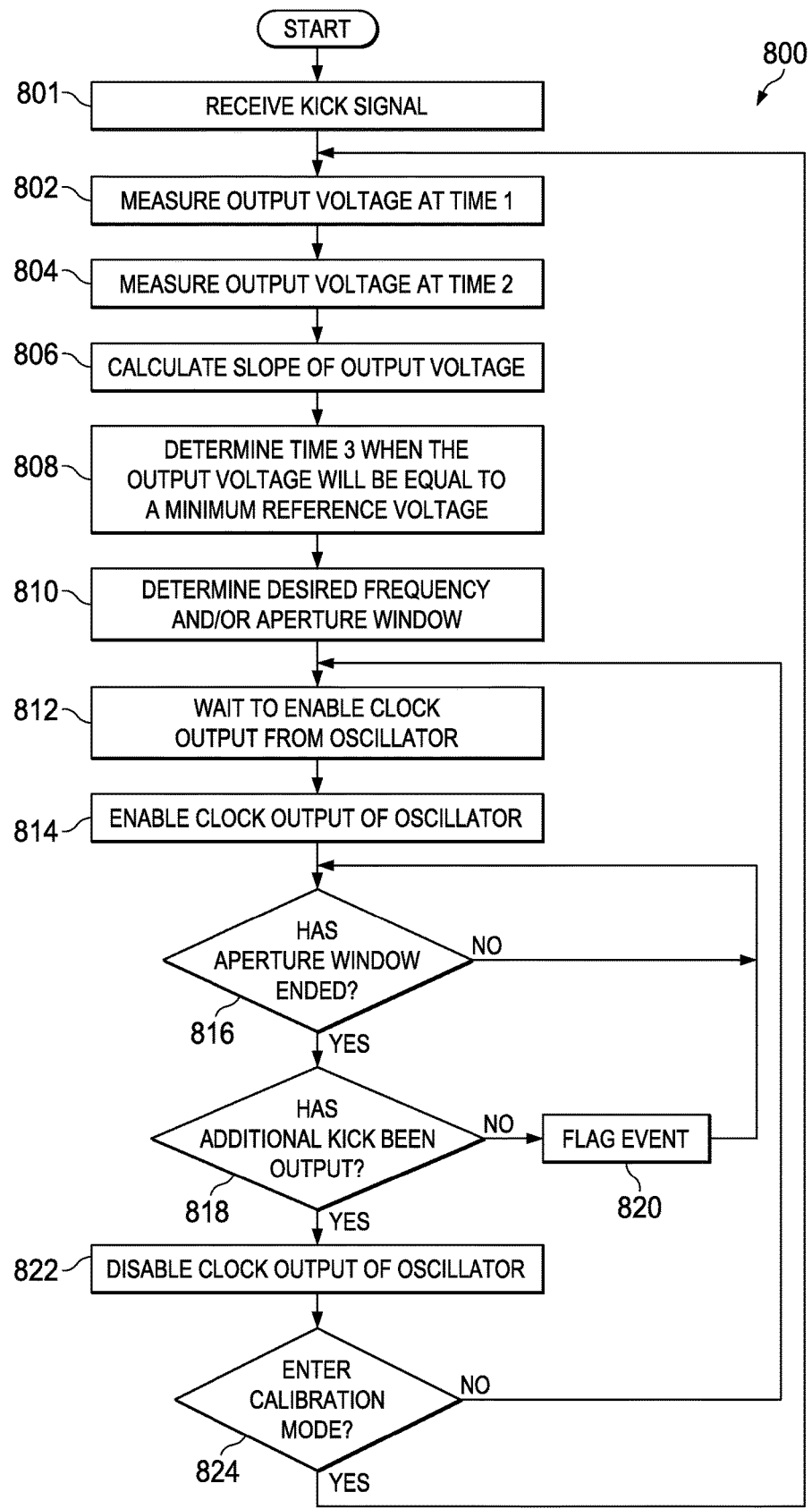
FIG. 8 is a flowchart representative of example machine readable instructions that may be executed to implement the example clock controller of FIG. 4 to determine the aperture window and/or the clock frequency to control the example comparator of FIG. 2.

The example machine readable instructions illustrated in FIG. 8 may be executed to cause the clock controller 202 of FIG. 4 to determine an aperture window and/or adjust a clock cycle frequency in conjunction with FIG. 2. Although the example flowchart 800 of FIG. 8 depicts example steps in a given order, these steps are not exhaustive, various changes and modifications may be affected by one skilled in the art within the spirit and scope of the disclosure. For example, blocks illustrated in the flowchart 800 may be performed in an alternative order or may be performed in parallel.

FIG. 8 is an example flowchart 800 representative of example machine readable instructions that may be executed to cause the clock controller 202 of FIG. 4 to determine an aperture window and/or adjust a clock cycle frequency to enable the example comparator 102 of FIG. 2. Since the falling edge of the output voltage $V_{out}$ 116 depends on the example load current $I_{load}$ 120 which can change at any moment, the aperture window and/or the clock frequency may be adjusted to either reduce voltage error or decrease $I_q$ (e.g., power consumption). Determining how and/or when to adjust the aperture window and/or the clock cycle frequency is accomplished by measuring the slope of the output voltage $V_{out}$ 116 based on a duration of time between kicks.

At block 801, the example slope calculator 400 receives a kick on the comparator output 108. As previously described, the kick is output when the example scaled output voltage 104 is less than the example reference voltage $V_{ref}$ 106. The kick enables the example converter 114 to increase the output voltage $V_{out}$ 116 which is stored in the output capacitor 118. Once the example converter 114 is disabled, the charge in the output capacitor 118 begins to discharge (e.g., $V_{out}$ 116 begins to fall). At time 1, the slope calculator 400 measures a first voltage $V_1$ of the falling output voltage $V_{out}$ 116 (block 802). At time 2, the slope calculator 400 measured a second voltage $V_2$ of the falling output voltage $V_{out}$ 116 (block 804).

At block 806, the example slope calculator 400 determines the slope of the falling output voltage $V_{out}$ 116 based on time 1, time 2, $V_1$, and $V_2$ $$\left(\text{e.g., } m = \frac{V_2 - V_1}{t_2 - t_1}\right).$$

In some examples, the example slope calculator 400 may measure the output voltage $V_{out}$ 116 at additional times to provide more values to accurately determine a function indicative of the falling edge of the output voltage $V_{out}$ 116 (e.g., when the falling edge is not linear). Once the slope has been calculated, the example time calculator 402 calculates time 3 (e.g., when the output voltage $V_{out}$ 116 will equal the reference voltage $V_{ref}$ 106) (block 808). In some examples, the time calculator 402 determines the determines time 3 based on a linear equation (e.g., $V_{ref} - V_1 = m(t_3 - t_1)$). Alternatively, when the falling output voltage $V_{out}$ is not linear, the time calculator 402 may interpolate and/or extrapolate a function to determine time 3.

At block 810, the aperture window/frequency determiner 404 determines a desired clock cycle frequency and/or an aperture window based on the determined slope and/or time 3. As previously described, the desired frequency and/or aperture window can be based on a user requirement, a manufacture requirement, a maximum allowable voltage error, and/or voltage requirements of other IC components within and/or connected to the example IC 200 of FIG. 2.

Once time 3 has been calculated, the oscillator controller 406 waits to enable the example oscillator 124 (block 812). As previously described, the oscillator controller 406 enables the oscillator during the aperture window around time 3. For example, if the aperture window is 200 milliseconds and time 3 is 750 milliseconds, the example oscillator controller 406 will send instructions to the example oscillator 124 to output a clock cycle at the desired frequency from 650 milliseconds (e.g., 100 millisecond before the 750 millisecond mark) to 850 milliseconds (e.g., 100 milliseconds after the 750 millisecond mark).

At block 814, the oscillator controller 406 sends instructions to the example oscillator 124 to output a clock cycle at the desired frequency. At block 816, the example oscillator controller 406 determines if the aperture window has ended. If the aperture window has not yet ended, the oscillator controller 406 continues to output the clock cycle until the aperture window ends. In some examples, the oscillator controller 406 determines when the aperture window has ended by polling and/or counting a number of clock pulses from the example oscillator 124. Alternatively, the clock controller 202 may poll and/or track the aperture window with an internal clock of the clock controller 202. If the aperture window has ended, the oscillator controller 406 determines if an additional (e.g., a second) kick has been output by the example comparator 102 (block 818). Since the estimated time 3 and aperture window is based on when the output voltage $V_{out}$ 116 should be equal to the reference voltage $V_{ref}$ 106 (e.g., when the additional kick should be received), not receiving the kick is indicative of an error and additional waiting time may need to be executed. If the additional kick has not been output, the oscillator controller 406 flags the event and the example oscillator continues to output the clock cycle (block 820). In some examples, the flag may trigger an error signal and/or a reset of all or part of the illustrated example IC 200. If the additional kick has been output, the oscillator controller 406 disables the clock output of the example oscillator 822 and the process repeats based on a new falling edge of the output voltage $V_{out}$ 116 (block 822).

At block 824, the aperture window/frequency determiner 404 determines whether to enter a calibration mode. Calibration mode is the process of determining when the output voltage will be equal to a minimum reference voltage based on measuring the output voltage at two or more times. In some examples, the determination of when to enter a calibration mode may be based on a change in slope from a first measurement to a second following measurement. In some examples, the aperture window/frequency determiner 404 may determine to enter calibration mode based on a triggering of an event flag. In some examples, the aperture window/frequency determiner 404 may decide to enter calibration based on user preference, manufacture preference, maximum allowable voltage error, other component requirements, and/or a signal from another controller. If the aperture window/frequency determiner 404 determines to enter calibration mode, the process of measuring the output voltage is repeated. If the aperture window/frequency determiner 404 determines not to enter calibration mode the oscillator controller 406 waits to enable the example oscillator 124.

Figure 9:
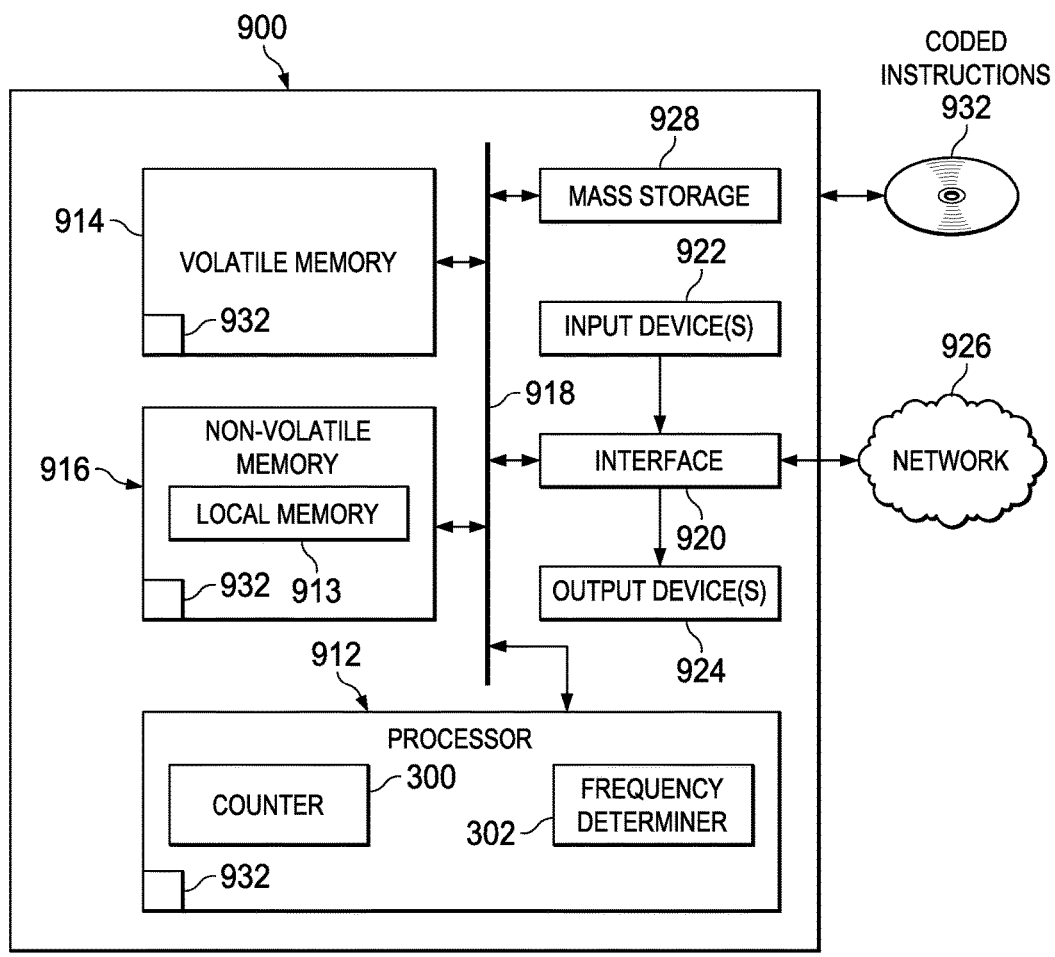
FIG. 9 is a block diagram of a processor platform structured to execute the example machine readable instructions of FIG. 7 to control the example clock controller of FIGS. 1 and 3.

FIG. 9 is a block diagram of an example processor platform 900 capable of executing the instructions of FIG. 7 to implement the example clock controller 122 of FIGS. 1 and 3. The processor platform 900 can be, for example, a server, a personal computer, a mobile device (e.g., a cell phone, a smart phone, a tablet such as an iPad™), a personal digital assistant (PDA), an Internet appliance, or any other type of computing device.

The processor platform 900 of the illustrated example includes a processor 912. The processor 912 of the illustrated example is hardware. For example, the processor 912 can be implemented by integrated circuits, logic circuits, microprocessors or controllers from any desired family or manufacturer.

The processor 912 of the illustrated example includes a local memory 913 (e.g., a cache). The example processor 912 of FIG. 9 executes the instructions of FIG. 7 to implement the example counter 300 and the example frequency determiner of FIG. 3 to implement the example clock controller 122. The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a clock controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

The coded instructions 932 of FIG. 7 may be stored in the mass storage device 928, in the volatile memory 914, in the non-volatile memory 916, and/or on a removable tangible computer readable storage medium such as a CD or DVD.

Figure 10:
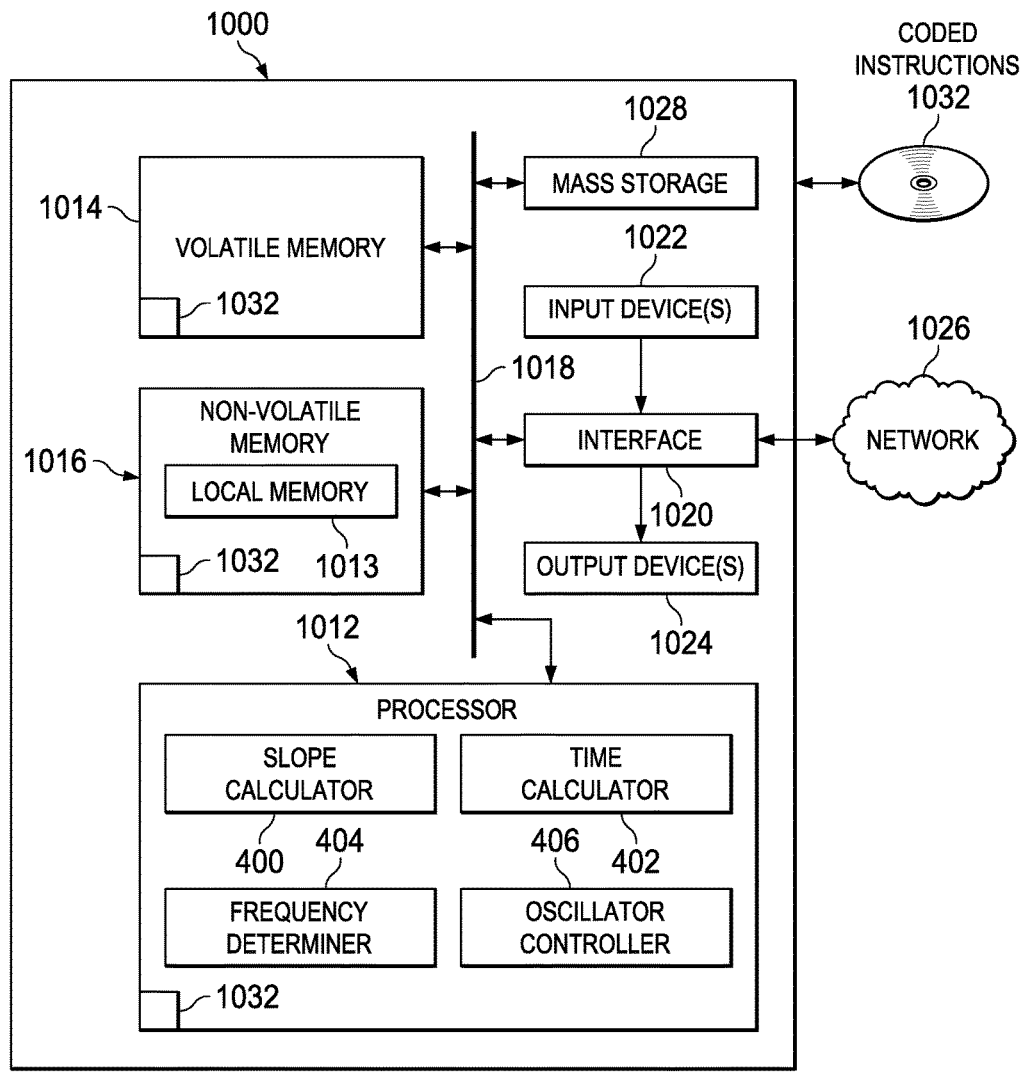
FIG. 10 is a block diagram of a processor platform structured to execute the example machine readable instructions of FIG. 8 to control the example clock controller of FIGS. 2 and 4.

FIG. 10 is a block diagram of an example processor platform 1000 capable of executing the instructions of FIG. 8 to implement the example clock controller 202 of FIGS. 2 and 4. The processor platform 1000 can be, for example, a server, a personal computer, a mobile device (e.g., a cell phone, a smart phone, a tablet such as an iPad™), a personal digital assistant (PDA), an Internet appliance, or any other type of computing device.

The processor platform 1000 of the illustrated example includes a processor 1012. The processor 1012 of the illustrated example is hardware. For example, the processor 1012 can be implemented by integrated circuits, logic circuits, microprocessors or controllers from any desired family or manufacturer.

The processor 1012 of the illustrated example includes a local memory 1013 (e.g., a cache). The example processor 1012 of FIG. 10 executes the instructions of FIG. 8 to implement the example slope calculator 400, the example time calculator 402, the example aperture window/frequency determiner 404, and the example oscillator controller 406 of FIG. 4 to implement the example clock controller 202. The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a clock controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and commands into the processor 1012. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

The coded instructions 1032 of FIG. 8 may be stored in the mass storage device 1028, in the volatile memory 1014, in the non-volatile memory 1016, and/or on a removable tangible computer readable storage medium such as a CD or DVD.

From the foregoing, it would be appreciated that the above disclosed methods, apparatus, and articles of manufacture power reduce $I_q$ in a comparator while minimizing voltage error. Using the examples disclosed herein, a comparator can respond to a 20 millivolt voltage error in less than 500 nanoseconds while drawing less than 15 nanoamps (nA) of $I_q$. Further, using the examples disclosed herein, the example comparator is 85%-90% power efficiency when a load is around 1 microamp (e.g., the load associated with sleep mode). In some examples, a clock cycle at a desired frequency is output by an oscillator to enable a comparator at a peak, a valley, a rising edge, and/or a falling edge of each clock cycle. In such examples, a count of clock cycles is used to determine if the desired frequency needs to be increased or decreased. In some examples, a slope of a falling edge of an output voltage is determined in order to determine an aperture window and/or a desired frequency to operate the oscillator.

Conventional comparators draw anywhere from 300 nA to 720 nA of $I_q$, and is therefore much less power efficient that methods described herein. Less power efficient comparators lead to reduced battery life of electronics that include comparators and/or power converters. Also, since comparators are already located in most ICs involving power converters, there is no need to add additional circuitry to the existing Integrated Circuits, saving both complexity and cost.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. An apparatus comprising:
   a comparator to:
      receive a first voltage and a reference voltage; and
      output a second voltage when the first voltage is lower than the reference voltage, wherein the outputting of the second voltage increases the first voltage; and
   a controller to:
      count a number of clock cycles while the first voltage is higher than the reference voltage;
      compare the number of clock cycles to a maximum number of clock cycles and a minimum number of clock cycles;
      when the number of clock cycles is above the maximum number of clock cycles, decrease a frequency of a clock associated with the number of clock cycles; and
      when the number of clock cycles is below the minimum number of clock cycles, increase the frequency of the clock.

2. The apparatus of claim 1, further including an oscillator to output the clock at the frequency.

3. The apparatus of claim 1, wherein the first voltage is an output voltage, the outputting of the second voltage is to charge a capacitor associated with the output voltage.

4. The apparatus of claim 3, wherein the first voltage decreases after the capacitor is charged.

5. The apparatus of claim 1, further including a direct current (DC) to DC converter to receive the second voltage and output the first voltage when the second voltage is being received.

6. The apparatus of claim 1, wherein the comparator is structured is to output the second voltage at an edge of the clock.

7. The apparatus of claim 1, wherein:
increasing the frequency increases average current and increases a response time of the comparator; and
decreasing the frequency decreases average current and decreases the response time of the comparator.

8. The apparatus of claim 1, wherein the maximum number of clock cycles and the minimum number of clock cycles are predetermined.

9. The apparatus of claim 1, wherein decreasing the predetermined frequency of the clock cycles decreases the number of clock cycles to a level below the maximum number of clock cycles.

10. The apparatus of claim 1, wherein increasing the predetermined frequency of the clock cycles increases the number of clock cycles to a level above the minimum number of clock cycles.

11. A method comprising:
receiving a first voltage and a reference voltage;
outputting a second voltage when the first voltage is lower than the reference voltage, wherein the outputting of the second voltage increases the first voltage;
counting a number of clock cycles while the first voltage is higher than the reference voltage;
comparing the number of clock cycles to a maximum number of clock cycles and a minimum number of clock cycles;
when the number of clock cycles is above the maximum number of clock cycles, decreasing a frequency of a clock associated with the number of clock cycles; and
when the number of clock cycles is below the minimum number of clock cycles, increasing the frequency of the clock.

12. The method of claim 11, further including outputting the clock at the frequency.

13. The method of claim 11, wherein the first voltage is an output voltage, the outputting of the second voltage is to charge a capacitor associated with the output voltage.

14. The method of claim 13, wherein the first voltage decreases after the capacitor is charged.

15. The method of claim 11, further including receiving the second voltage and outputting the first voltage when the second voltage is being received.

16. The method of claim 11, further including outputting the second voltage at an edge of the clock.

17. The method of claim 11, wherein:
increasing the frequency increases average current and increases a response time of a comparator; and
decreasing the frequency decreases average current and decreases the response time of the comparator.

18. The method of claim 11, wherein the maximum number of clock cycles and the minimum number of clock cycles are predetermined.

19. The method of claim 11, wherein decreasing the predetermined frequency of the clock cycles decreases the number of clock cycles to a level below the maximum number of clock cycles.

20. The method of claim 11, wherein increasing the predetermined frequency of the clock cycles increases the number of clock cycles to a level above the minimum number of clock cycles.

* * * * *